United States Patent
Li et al.

(10) Patent No.: US 6,902,874 B2
(45) Date of Patent: Jun. 7, 2005

(54) RESIST COMPOSITIONS WITH POLYMERS HAVING 2-CYANO ACRYLIC MONOMER

(75) Inventors: Wenjie Li, Poughkeepsie, NY (US); Pushkara Rao Varanasi, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 13 days.

(21) Appl. No.: 10/673,783

(22) Filed: Sep. 29, 2003

(65) Prior Publication Data
US 2004/0072099 A1 Apr. 15, 2004

Related U.S. Application Data

(62) Division of application No. 09/886,428, filed on Jun. 21, 2001, now Pat. No. 6,635,401.

(51) Int. Cl.$^7$ .............................................. H01L 21/44
(52) U.S. Cl. ..................... 430/323; 430/311; 430/313; 430/314; 430/324
(58) Field of Search ........................... 430/270.1, 281.1, 430/286.1, 287.1, 288.1, 310, 311, 313, 314, 323, 324, 5

(56) References Cited

U.S. PATENT DOCUMENTS 6,627,391 B1 * 9/2003 Ito et al. ..................... 430/322
2002/0187419 A1 * 12/2002 Dammel et al. ......... 430/270.1

* cited by examiner

Primary Examiner—Barbara L. Gilliam
(74) Attorney, Agent, or Firm—Steven Capella

(57) ABSTRACT

Acid-catalyzed positive resist compositions which are imageable with 193 nm radiation and/or possibly other radiation and are developable to form resist structures of improved development characteristics and improved etch resistance are enabled by the use of resist compositions containing imaging polymer having a 2-cyano acrylic monomer.

7 Claims, No Drawings

RESIST COMPOSITIONS WITH POLYMERS HAVING 2-CYANO ACRYLIC MONOMER

This application is a divisional of U.S. patent application Ser. No. 09/886,428 filed Jun. 21, 2001, now U.S. Pat. No. 6,635,401 issued on Oct. 21, 2003.

CROSS REFERENCE TO RELATED APPLICATIONS

Related applications are: U.S. patent application Ser. No. 09/266,342, filed Mar. 11, 1999, titled "Photoresist Compositions with Cyclic Olefin Polymers and Additive"; U.S. patent application Ser. No. 09/266,343, filed Mar. 11, 1999, titled "Photoresist Compositions with Cyclic Olefin Polymers and Hydrophobic Non-Steroidal Alicyclic Additives"; U.S. patent application Ser. No. 09/266,341, filed Mar. 11, 1999, now U.S. Pat. No. 6,124,074, titled "Photoresist Compositions with Cyclic Olefin Polymers and Hydrophobic Non-Steroidal Multi-Alicyclic Additives"; and U.S. patent application Ser. No. 09/266,344, filed Mar. 11, 1999, titled "Photoresist Compositions with Cyclic Olefin Polymers and Saturated Steroid Additives". Additional related applications are: U.S. patent application Ser. No. 09/566,395, filed May 5, 2000, now U.S. Pat. No. 6,251,560, titled "Photoresist Compositions with Cyclic Olefin Polymers Having Lactone Moiety"; U.S. patent application Ser. No. 09/566,397, filed May 5, 2000, now abn., titled "Copolymer Photoresist with Improved Etch Resistance"; U.S. patent application Ser. No. 09/639,784, filed Aug. 16, 2000, now U.S. Pat. No. 6,391,521, titled "Resist Compositions Containing Bulky Anhydride Additives"; and U.S. patent application Ser. No. 09/639,784, filed Aug. 16, 2000, now U.S. Pat. No. 6,391,521, titled "Resist Compositions Containing Lactone Additives." The disclosures of the above applications are incorporated herein by reference.

BACKGROUND OF THE INVENTION

In the microelectronics industry as well as in other industries involving construction of microscopic structures (e.g. micromachines, magnetoresistive heads, etc.), there is a continued desire to reduce the size of structural features. In the microelectronics industry, the desire is to reduce the size of microelectronic devices and/or to provide greater amount of circuitry for a given chip size.

The ability to produce smaller devices is limited by the ability of lithographic techniques to reliably resolve smaller features and spacings. The nature of optics is such that the ability to obtain finer resolution is limited in part by the wavelength of light (or other radiation) used to create the lithographic pattern. Thus, there has been a continual trend toward use of shorter light wavelengths for lithographic processes. Recently, the trend has been to move from so-called I-line radiation (350 nm) to 248 nm radiation with 193 nm radiation lithography on the immediate horizon.

While a resist composition must possess desirable optical characteristics to enable image resolution at a desired radiation wavelength, the resist composition must also possess suitable chemical and mechanical properties to enable transfer to the image from the patterned resist to an underlying substrate layer(s). For example, the ability of the resist to wet and adhere to the underlying substrate must be adequate especially where relatively thin resist layers are employed to enhance resolution performance. The resist must also be relatively stable with good shelf life such that the required radiation dose to image the resist composition remains predictable.

The patterned resist structure (after development) must be sufficiently resistant to enable transfer of the pattern to the underlying layer(s). Typically, pattern transfer is performed by some form of wet chemical etching or ion etching. The ability of the patterned resist layer to withstand the pattern transfer etch process (i.e., the etch resistance of the resist layer) is an important characteristic of the resist composition.

While some resist compositions have been designed for use with 193 nm radiation, these compositions have often failed to deliver the true resolution benefit of shorter wavelength imaging due to a lack of performance in one or more of the above mentioned areas.

SUMMARY OF THE INVENTION

The invention provides resist compositions which are capable of high resolution lithographic performance with (a) improved stability/shelf-life, (b) improved etch resistance, (c) improved wettability, and/or (d) improved thin film adhesion. The resists of the invention are preferably imageable using 193 nm imaging radiation (and possibly also with other imaging radiation).

The invention also provides lithographic methods using the resist compositions of the invention to create resist structures and methods using the resist structures to transfer patterns to an underlying layer(s). The lithographic methods of the invention are preferably characterized by the use of 193 nm ultraviolet radiation patternwise exposure. The methods of the invention are preferably capable of resolving features of less than about 150 nm in size, more preferably less than about 130 nm in size without the use of a phase shift mask.

In one aspect, the invention encompasses a resist composition comprising: (a) an imaging polymer, and (b) a radiation-sensitive acid generator, the imaging polymer comprising 2-cyano acrylic monomer units (hereafter also referred to as "CNA monomer"). The CNA monomer preferably is an acrylic acid or has a pendant ester group COO—R where R contains one or more functional and/or non-functional moieties such as acid-labile moieties, polar moieties, and/or non-acid-labile, non-polar moieties. The CNA monomer is generally capable of copolymerizing with cyclic olefins under free radical polymerization conditions.

Preferably, the imaging polymer contains (i) cyclic olefin monomeric units in the polymer backbone (i.e., the polymerizable portion of monomeric units making up the polymer), and/or (ii) alicyclic moieties as bulky end groups on at least some monomeric units. In the absence of generated acid, the imaging polymer is preferably substantially insoluble in aqueous alkaline solutions such that the resist is a positive resist.

In another aspect, the invention encompasses imaging polymers containing CNA monomer.

In another aspect, the invention encompasses a method of creating a patterned resist structure on a substrate, the method comprising:

(a) providing a substrate having a surface layer of the resist composition of the invention, (b) patternwise exposing the resist layer to imaging radiation whereby portions of the resist layer are exposed to radiation, and (c) contacting the resist layer with an aqueous alkaline developer solution to remove the exposed portions of the resist layer to create the patterned resist structure. Preferably, the radiation used in step (b) in the above method is 193 nm ultraviolet radiation. The invention also encompasses processes for making conductive, semiconductive, magnetic or insulative structures using the patterned resist structures containing the compositions of the invention.

These and other aspects of the invention are discussed in further detail below.

DETAILED DESCRIPTION OF THE INVENTION

The resist compositions of the invention are generally characterized by the presence of an imaging polymer which contains CNA monomer units. These compositions are preferably capable of providing high resolution lithographic patterns using 193 nm radiation with (a) improved stability/shelf-life, (b) improved etch resistance, (c) improved wetability, and/or (d) improved thin film adhesion. The invention further encompasses patterned resist structures containing the resist compositions of the invention, as well as processes for creating the resist structures and using the resist structures to form conductive, semiconductive and/or insulative structures. The invention also encompasses imaging polymers containing CNA monomer.

The resist compositions of the invention generally comprise (a) an imaging polymer, and (b) a radiation-sensitive acid generator, the imaging polymer comprising CNA monomer units. Preferred CNA monomeric units may be represented by the structure:

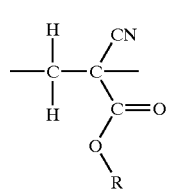

(I)

where R is H or COO—R is an ester group.

R preferably contains one or more moieties such as acid-labile moieties, polar moieties, and/or non-acid-labile, non-polar moieties.

The acid-labile moieties preferably act to inhibit solubility of the resist composition in aqueous alkaline solutions. The acid-labile moieties are preferably selected from the group consisting of tertiary alkyl (or cycloalkyl) esters (e.g., t-butyl, methyl cyclopentyl, methyl cyclohexyl, methyl adamantyl), ketals, and acetals. Tertiary butyl ester and methyl cyclopentyl ester are most preferred acid-labile protecting moieties.

Polar moieties preferably promote the solubility of the resist in aqueous alkaline solutions. Preferred polar moieties are selected from the group consisting of carboxylic acids, lactones, amides, imides, sulfonamides, —CH(CF$_3$)OH, and —C(CF$_3$)$_2$OH.

The non-acid-labile, non-polar moieties are preferably selected from the group consisting of primary and secondary linear, branched, and cyclic alkyls, and/or aryls. The non-acid-labile, non-polar moieties preferably have 1–12 carbons. The alkyls are more preferred.

R may further include other moieties such as spacer groups between the functional moieties described above and the oxygen of the ester. Preferred spacers are C$_x$H$_{2x}$ and C$_x$H$_{2x}$O$_y$ moieties where x and y are preferably 1–6.

The imaging polymer may be a homopolymer of the CNA monomer described above or may contain other monomeric units in addition to the CNA monomer. For example, the imaging polymer may contain one or more of the following:

(a) cyclic olefin monomers containing acid labile moieties which inhibit the solubility of the resist in aqueous alkaline solutions, (b) cyclic olefin monomeric units having polar moieties which promote solubility in aqueous alkaline solutions, (c) cyclic olefin monomeric units having pendant lactone moieties such as those described in U.S. patent application Ser. No. 09/566,395 referenced above, (d) other cyclic olefin monomeric units not falling under (a)-(c), e.g., monomeric units having no pendant moieties, or pendant moieties which are non-polar and non-acid labile, etc., (e) non-cyclic olefin monomeric units capable of undergoing free-radical copolymerization with the CNA monomer, such as those described in U.S. patent application Ser. No. 09/566,397 referenced above, and/or (f) other monomeric units that are compatible with the function of the polymer as component of the resist.

Cyclic olefin units (a) may be any cyclic olefin monomeric unit having acid labile moieties that inhibit solubility in aqueous alkaline solutions. Examples of cyclic olefin monomers include the following monomers illustrated by structure (II) below where at least one of R$_1$ to R$_4$ independently represents an acid-labile protecting moiety and q is zero or some positive integer (preferably q is 0 or 1). R$_1$ to R$_4$ can independently represent hydrogen, linear and branched (C$_1$ to C$_{10}$) alkyl, so long as at least one of the remaining R$_1$ to R$_4$ substituents is selected from acid-labile protecting moieties:

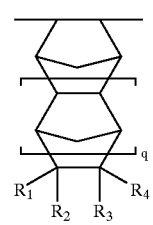

(II)

More preferably, the cyclic olefin units (a) are selected from:

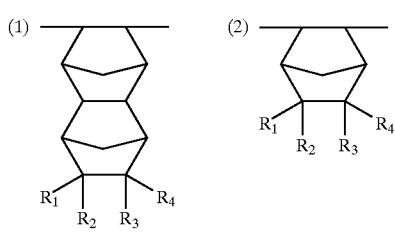

(III)

where at least one of R$_1$ to R$_4$ independently represents an acid-labile protecting moiety. R$_1$ to R$_4$ can independently represent hydrogen, linear and branched (C$_1$ to C$_{10}$) alkyl, so long as at least one of the remaining R$_1$ to R$_4$ substituents is selected from acid-labile protecting moieties. Preferred acid-labile protecting moieties are selected are selected from the group consisting of tertiary alkyl (or cycloalkyl) esters (e.g., t-butyl, methyl cyclopentyl, methyl cyclohexyl, methyl adamantyl), ketals, and acetals. Tertiary butyl carboxyl ester and methyl cyclopentyl are most preferred acid-labile protecting moieties. If desired, combinations of cyclic olefin units (a) having differing protecting functional groups may be used.

Cyclic olefin units (b) and (c) may be any cyclic olefin monomeric unit having a polar functional group that promotes alkaline solubility. Examples of cyclic olefin monomers include the following monomers illustrated by structure (IV) below where at least one of $R_5$ to $R_8$ independently represents a polar moiety and q is zero or some positive integer (preferably q is 0 or 1). $R_5$ to $R_8$ can independently represent hydrogen, linear and branched ($C_1$ to $C_{10}$) alkyl, so long as at least one of the remaining $R_5$ to $R_8$ substituents is selected from polar moieties:

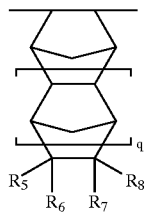

(IV)

More preferably, the cyclic olefin units (b) and (c) are selected from:

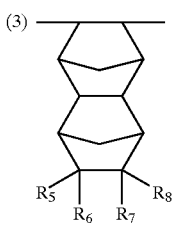 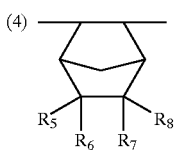

(V)

where at least one of $R_5$ to $R_8$ independently represents a polar moiety. $R_5$ to $R_8$ can independently represent hydrogen, linear and branched ($C_1$ to $C_{10}$) alkyl, so long as at least one of the remaining $R_5$ to $R_8$ substituents is selected from polar moieties. Preferred polar moieties contain polar groups selected from the group consisting of carboxyl, sulfonamidyl, imidyl, fluoroalcohol, lactone, and other polar groups. If desired, combinations of cyclic olefin units (b) and (c) having differing acidic polar functional groups may be used.

Cyclic olefin monomeric units (d) preferably have the structure:

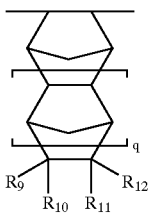

(VI)

where q is zero or an integer and $R_9$ to $R_{12}$ independently represent hydrogen, linear, branched, and cyclic ($C_1$ to $C_{10}$) alkyl. More preferably, monomeric unit (d) is selected from:

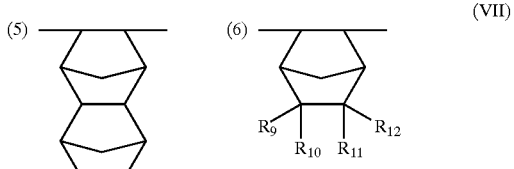

(VII)

where $R_9$ to $R_{12}$ independently represent hydrogen, linear, branched, and cyclic ($C_1$ to $C_{10}$) alkyl. If desired, a combination of cyclic olefin monomeric units (d) may be used.

Non-cyclic olefin monomeric units (e) are preferably acrylate and methacrylate monomers.

As noted above, the selection of R group of the CNA monomer and the selection of any other monomers to be contained in the imaging polymer is preferably such that the imaging polymer contains cyclic olefin backbone units and/or alicyclic moieties in at least some pendant groups.

In general, for lithographic applications used in the manufacture of integrated circuit structures and other microscopic structures, the imaging polymers of invention preferably comprise at least about 10 mole % of CNA monomeric units, more preferably about 10–70 mole %, most preferably about 40–60 mole %. Otherwise, the amount of other constituents in the imaging polymer preferably are those found in polymers for resist formulations used with 193 nm imaging radiation (i.e., CNA monomeric units containing acid-labile moieties can be used instead of at least a portion of the acid-labile moiety-containing monomeric units in those polymers and/or CNA monomeric units containing polar moieties can be used instead of at least a portion of the polar moiety-containing monomeric units, etc.). Thus, for example, in the polymers described in U.S. Pat. Nos. 5,843,624; 6,124,074; and 6,177,228, the disclosures of which are incorporated herein by reference, and U.S. patent application Ser. No. 09/566,395 and 09/566,397 (referenced above), the specified monomeric units containing acid-labile moieties could be replaced at least in part with CNA monomeric units containing acid-labile moieties. It should be understood that the invention is not limited to the use of CNA monomeric units in any specific polymer or specific resist formulation.

In addition to the imaging polymers, the resist compositions of the invention contain a radiation-sensitive (photosensitive) acid generator. The invention is not limited to the use of any specific acid generator or combination of acid generators, that is the benefits of the invention may be achieved using various acid generators known in the art. Preferred acid generators are those which contain reduced amounts (or preferably zero) aryl moieties. Where aryl-containing acid generator is employed, the absorptive characteristics of the acid generator at 193 nm may restrict the amount of acid generator that can be included in the formulation.

Examples of suitable acid generators include (but preferably with alkyl substituted for one or more of any indicated aryl moieties) onium salts such as triaryl sulfonium hexafluoroantimonate, diaryliodonium hexafluoroantimonate, hexafluoroarsenates, triflates, perfluoroalkane sulfonates (e.g., perfluoromethane sulfonate, perfluorobutane, perfluorohexane sulfonate, perfluorooctane sulfonate etc.), perfluoroalkyl sulfonyl imide, perfluoroalkyl sulfonyl methide, perfluoroaryl sulfonyl imide, perfluoroaryl sulfonyl methide, substituted aryl sulfonates such as pyrogallois (e.g. trimesylate of pyrogallol or tris(sulfonate) of pyrogallol), sulfonate esters of hydroxyimides, N-sulfonyloxynaphthalimides (N-camphorsulfonyloxynaphthalimide, N-pentafluorobenzenesulfonyloxynaphthalimide), α–α' bis-sulfonyl diazomethanes, naphthoquinone-4-diazides, alkyl disulfones and others.

The resist compositions of the invention may contain a bulky, hydrophobic additive ("BH" additives) which is substantially preferably transparent to 193 nm radiation. The BH additives have generally enable and/or enhance the ability to resolve ultrafine lithographic features in response to conventional aqueous alkaline developers. The BH additives are preferably characterized by the presence of at least one alicyclic moiety. Preferably, the BH additive contains at least about 10 carbon atoms, more preferably at least 14 carbon atoms, most preferably about 14 to 60 carbon atoms. The BH additive preferably contains one or more additional moieties such as acid-labile pendant groups which undergo cleaving in the presence of acid to provide a constituent which acts to promote alkaline solubility of the radiation-exposed portions of the resist. Preferred BH additives are selected from the group consisting of saturated steroid compounds, non-steroidal alicyclic compounds, and non-steroidal multi-alicyclic compounds having plural acid-labile connecting groups between at least two alicyclic moieties. More preferred BH additives include lithocholates such as t-butyl-3-trifluoroacetyllithocholate, t-butyl adamantane carboxylate, and bis-adamantyl t-butyl carboxylate. Bis-adamantyl t-butyl carboxylate is a most preferred BH additive. If desired, a combination of BH additives can be used.

The resist compositions of the invention will typically contain a solvent prior to their application to the desired substrate. The solvent may be any solvent conventionally used with acid-catalyzed resists which otherwise does not have any excessively adverse impact on the performance of the resist composition. Preferred solvents are propylene glycol monomethyl ether acetate, gama-butyrolactone, cyclohexanone, and ethyl cellosolve acetate.

The compositions of the invention may further contain minor amounts of auxiliary components such as dyes/sensitizers, base additives, etc. as are known in the art. Preferred base additives are weak bases which scavenge trace acids while not having an excessive impact on the performance of the resist. Preferred base additives are (aliphatic or alicyclic) tertiary alkyl amines or t-alkyl ammonium hydroxides such as t-butyl ammonium hydroxide (TBAH).

The resist compositions of the invention preferably contain about 0.5–20 wt. % (more preferably about 3–10 wt. %) acid generator based on the total weight of imaging polymer in the composition. Where a solvent is present, the overall composition preferably contains about 50–90 wt. % solvent. The composition preferably contains about 1 wt. % or less of said base additive based on the total weight of imaging polymer. The resist compositions of the invention preferably contain at least about 5 wt. % of the BH additive component based on the total weight of imaging polymer in the composition, more preferably about 10–25 wt. %, most preferably about 10–20 wt. %.

The CNA monomers and other monomers used in the present invention may be synthesized by known techniques.

The invention is not limited to any specific method of synthesizing the imaging polymers used in the invention. Preferably, the imaging polymers are formed by free radical polymerization. Examples of other suitable techniques for cyclic olefin polymers and other polymers are disclosed in U.S. Pat. Nos. 5,468,819, 5,705,503, 5,843,624 and 6,048,664, the disclosures of which are incorporated herein by reference. The imaging polymers of the invention preferably have a weight average molecular weight of about 5,000–100,000, more preferably about 10,000–50,000.

The resist compositions of the invention can be prepared by combining the imaging polymer, acid generator, optional BH additive and any other desired ingredients using conventional methods. The resist composition to be used in lithographic processes will generally have a significant amount of solvent.

The resist compositions of the invention are especially useful for lithographic processes used in the manufacture of integrated circuits on semiconductor substrates. The compositions are especially useful for lithographic processes using 193 nm UV radiation. Where use of other radiation (e.g. mid-UV, 248 nm deep UV, x-ray, or e-beam) is desired, the compositions of the invention can be adjusted (if necessary) by the addition of an appropriate dye or sensitizer to the composition. The general use of the resist compositions of the invention in lithography for semiconductors is described below.

Semiconductor lithographic applications generally involve transfer of a pattern to a layer of material on the semiconductor substrate. The material layer of the semiconductor substrate may be a metal conductor layer, a ceramic insulator layer, a semiconductor layer or other material depending on the stage of the manufacture process and the desired material set for the end product. In many instances, an antireflective coating (ARC) is applied over the material layer before application of the resist layer. The ARC layer may be any conventional ARC which is compatible with acid catalyzed resists.

Typically, the solvent-containing resist composition is applied to the desired semiconductor substrate using spin coating or other technique. The substrate with the resist coating is then preferably heated (pre-exposure baked) to remove the solvent and improve the coherence of the resist layer. The thickness of the applied layer is preferably as thin as possible with the provisos that the thickness is preferably substantially uniform and that the resist layer be sufficient to withstand subsequent processing (typically reactive ion etching) to transfer the lithographic pattern to the underlying substrate material layer. The pre-exposure bake step is preferably conducted for about 10 seconds to 15 minutes, more preferably about 15 seconds to one minute. The pre-exposure bake temperature may vary depending on the glass transition temperature of the resist. Preferably, the pre-exposure bake is performed at temperatures which are at least 20° C. below $T_g$.

After solvent removal, the resist layer is then patternwise-exposed to the desired radiation (e.g. 193 nm ultraviolet radiation). Where scanning particle beams such as electron beam are used, patternwise exposure may be achieved by scanning the beam across the substrate and selectively applying the beam in the desired pattern. More typically, where wavelike radiation forms such as 193 nm ultraviolet radiation are used, the patternwise exposure is conducted through a mask which is placed over the resist layer. For 193 nm UV radiation, the total exposure energy is preferably about 100 millijoules/$cm^2$ or less, more preferably about 50 millijoules/$cm^2$ or less (e.g. 15–30.millijoules/$cm^2$).

After the desired patternwise exposure, the resist layer is typically baked to further complete the acid-catalyzed reaction and to enhance the contrast of the exposed pattern. The post-exposure bake is preferably conducted at about 100–175° C., more preferably about 125–160° C. The post-exposure bake is preferably conducted for about 30 seconds to 5 minutes.

After post-exposure bake, the resist structure with the desired pattern is obtained (developed) by contacting the resist layer with an alkaline solution which selectively dissolves the areas of the resist which were exposed to radiation. Preferred alkaline solutions (developers) are aqueous solutions of tetramethyl ammonium hydroxide. Preferably, the resist compositions of the invention can be developed with conventional 0.26 N aqueous alkaline solutions. The resist compositions of the invention can also be developed using 0.14 N or 0.21 N or other aqueous alkaline solutions. The resulting resist structure on the substrate is then typically dried to remove any remaining developer solvent. The resist compositions of the invention are generally characterized in that the product resist structures have high etch resistance. In some instances, it may be possible to further enhance the etch resistance of the resist structure by using a post-silylation technique using methods known in the art.

The pattern from the resist structure may then be transferred to the material (e.g., ceramic, metal or semiconductor) of the underlying substrate. Typically, the transfer is achieved by reactive ion etching or some other etching technique. In the context of reactive ion etching, the etch resistance of the resist layer is especially important. Thus, the compositions of the invention and resulting resist structures can be used to create patterned material layer structures such as metal wiring lines, holes for contacts or vias, insulation sections (e.g., damascene trenches or shallow trench isolation), trenches for capacitor structures, etc. as might be used in the design of integrated circuit devices.

The processes for making these (ceramic, metal or semiconductor) features generally involve providing a material layer or section of the substrate to be patterned, applying a layer of resist over the material layer or section, pattern-wise exposing the resist to radiation, developing the pattern by contacting the exposed resist with a solvent, etching the layer(s) underlying the resist layer at spaces in the pattern whereby a patterned material layer or substrate section is formed, and removing any remaining resist from the substrate. In some instances, a hard mask may be used below the resist layer to facilitate transfer of the pattern to a further underlying material layer or section. Examples of such processes are disclosed in U.S. Pat. Nos. 4,855,017; 5,362,663; 5,429,710; 5,562,801; 5,618,751; 5,744,376; 5,801,094; and 5,821,169, the disclosures of which patents are incorporated herein by reference. Other examples of pattern transfer processes are described in Chapters 12 and 13 of "Semiconductor Lithography, Principles, Practices, and Materials" by Wayne Moreau, Plenum Press, (1988), the disclosure of which is incorporated herein by reference. It should be understood that the invention is not limited to any specific lithography technique or device structure.

EXAMPLE 1

Synthesis of copolymer of methylcyclopentyl 5-norbornene-2-carboxylate (NBMCP) and ethyl 2-cyanoacrylate (ECNA)

To a 100 ml glass vial (pre-dried to remove moisture) equipped with a magnetic stir bar was added 8.8 g (0.04 mole) of NBMCP, 0.135 g (0.0008 mole) of 2,2'-azobisisobutyronitrile (AIBN), 50 ml of anhydrous toluene, and the solution was degassed under argon atmosphere. 5.0 g (0.04 mole) of ECNA was added to the solution inside the dry box via a syringe. The resulting mixture was slowly heated to 75° C. and allowed to stir at 75° C. for an additional hour. The solution was cooled and precipitated into hexane to obtain a white polymer. The polymer was collected by vacuum filtration, washed with hexane (3×25 ml) and methanol (3×25 ml), and dried at 60° C. in vacuum overnight. Yield=5.4 g, 40%. GPC was obtained in THF using Polystyrene standards. The molecular weight was observed to be $M_n$=6,500 dalton and $M_W$=12,200. $^{13}$C NMR indicated the presence of both NBMCP and ECNA monomer units. The concentration of NBMCP monomer unit was estimated to be 40 mole %. Thermogravimetric analysis (TGA) under nitrogen (heating rate 10° C./min.) showed that the polymer was thermally stable to about 155° C., and then exhibited approximately 20 wt. % loss by 220° C. (corresponding to deprotecton of the MCP group). The backbone degradation started at around 270° C.

EXAMPLE 2

Lithographic evaluation

For the purpose of lithographic experiments, a resist formulation containing the NBMCP-ECNA copolymer (Example 1) was prepared by combining the materials set forth below, expressed in part by weight.

| | |
|---|---|
| Cyclohexanone | 88.5 |
| NBMCP-ECNA copolymer (Example 1) | 11 |
| Di-t-butylphenyliodonium perfluorooctanesulfonate | 0.44 |
| perfluorobutylsulfonyloxybicyclo [2.2.1]-hept-5-ene-2,3-dicarboximide | 0.11 |
| Tetrabutylammonium hydroxide | 0.011 |

The resist formulation was spin-coated (for 30 seconds) onto an antireflective material (AR19, Shipley Company) layer applied on silicon wafers. The resist layer was soft-baked at 130° C. for 60 seconds on a vacuum hot plate to produce a film of about 0.36 μm thickness. The wafers were then exposed to 193 nm radiation (Nikon stepper, 0.6 NA). The exposure pattern was an array of lines and spaces of varying dimensions down to 0.1 μm. The exposed wafers were post-exposure baked on a vacuum hot plate at 130° C. for 90 seconds. The wafers were then (puddle) developed using 0.263 N tetramethyl ammonium hydroxide developer for 60 seconds. The patterns were examined by scanning electron microscopy (SEM). Line/space pairs of 150 nm and above were well resolved.

What is claimed is:

1. A method of forming a patterned material structure on a substrate, said material being selected from the group consisting of semiconductors, ceramics and metals, said method comprising:

(A) providing a substrate with a layer of said material, (B) applying a resist composition to said substrate to form a resist layer on said substrate, said resist composition comprising (a) an imaging polymer, and (b) a radiation sensitive acid generator, said imaging polymer comprising cyano-modified acrylic monomer units comprising an acrylic moiety with a cyano group pendant therefrom;

(C) patternwise exposing said substrate to radiation whereby acid is generated by said acid generator in exposed regions of said resist layer by said radiation, (D) contacting said substrate with an aqueous alkaline developer solution, whereby said exposed regions of said resist layer are selectively dissolved by said developer solution to reveal a patterned resist structure, and (E) transferring resist structure pattern to said material layer, by etching into said material layer through spaces in said resist structure pattern.

2. The method of claim 1 wherein said material is metal.

3. The method of claim 1 wherein said etching comprises reactive ion etching.

4. The method of claim 1 wherein at least one intermediate layer is provided between said material layer and said resist layer, and step (E) comprises etching through said intermediate layer.

5. The method of claim 1 wherein said radiation has a wavelength of about 193 nm.

6. The method of claim 1 wherein said substrate is baked between steps (C) and (D).

7. The method of claim 1 wherein said imaging polymer contains cyclic olefin monomeric units in a backbone portion of said polymer, and/or (ii) alicyclic moieties as bulky end groups.

* * * * *